United States Patent [19]

Shinohara

[11] Patent Number: 5,200,032

[45] Date of Patent: Apr. 6, 1993

[54] DRY ETCHING METHOD

[75] Inventor: Keiji Shinohara, Kanagawa, Japan

[73] Assignee: Sony Corporation, Tokyo, Japan

[21] Appl. No.: 813,342

[22] Filed: Dec. 24, 1991

[30] Foreign Application Priority Data

Dec. 27, 1990 [JP] Japan .................................. 2-415023

[51] Int. Cl.$^5$ .............................................. H01L 21/00
[52] U.S. Cl. .................................... 156/664; 156/643;
156/646; 156/666
[58] Field of Search ................. 156/646, 664, 666, 643

[56] References Cited

U.S. PATENT DOCUMENTS

| | | | |
|---|---|---|---|
| 4,352,724 | 10/1982 | Sugishima et al. | 204/192.37 |
| 4,412,885 | 11/1983 | Wang et al. | 156/659.1 |
| 4,451,327 | 5/1984 | Nelson | 156/666 |
| 4,505,782 | 3/1985 | Jacob et al. | 156/643 |
| 4,614,021 | 9/1986 | Hulseweh | 437/200 |
| 4,919,750 | 4/1990 | Bausmith et al. | 156/666 |
| 5,091,050 | 2/1992 | Fujino et al. | 156/666 |

FOREIGN PATENT DOCUMENTS 2-83930  3/1990  Japan .

OTHER PUBLICATIONS

Ohno et al., "Reactive Ion Etching of Copper Films in SiCl$_4$ and N$_2$ Mixture", *Japanese Journal of Applied Physics*, vol. 28, No. 6, Jun. 1989, pp. L1070–L1072.

Primary Examiner—Brian E. Hearn
Assistant Examiner—George Gondreau
Attorney, Agent, or Firm—Hill, Steadman & Simpson

[57] ABSTRACT

A dry etching method enabling etching of a layer of a copper (Cu) based material at a wafer heating temperature lower than heretofore, and a practically useful method for detecting the end point of etching. If the Cu layer is etched using an etching gas including a compound containing chlorine (Cl) and oxygen (O) as component elements or an etching gas including a compound containing Cl and a compound containing O as component elements, respectively, the Cu layer is removed not only in the form of copper chloride CuCl$_x$ but in the form of copper oxychloride CuCl$_x$O$_y$, where x is 1 to 2 and y is 1 to 8. Since CuCl$_x$O$_y$ has a vapor pressure lower than that of CuCl$_x$, a conventional etching reaction product, it is unnecessary to heat the wafer to higher temperatures as in the conventional practice, while there is no risk of a copper oxide film being formed on the surface of the Cu layer. The end point of etching may be detected by detecting a decrease in emission peak intensities in the molecular spectrum of CuCl appearing the specific wavelengths, such as 402 nm or 433 nm.

3 Claims, 2 Drawing Sheets

DRY ETCHING METHOD

BACKGROUND OF THE INVENTION

1. Field of the Invention

This invention relates to a dry etching method used for etching of a layer of a copper-based material in the preparation of a semiconductor device. More particularly, it relates to a method for lowering the range of the etching temperature and detecting the etching end point.

2. Description of the Prior Art

In keeping up with the tendency in recent years towards a higher degree of integration and higher performance of semiconductor devices, as with VLSIs or ULSIs, the design rule of metal interconnections tends to be refined to an order of submicrons or even to an order of quarter microns. Up to now, the metal interconnections in semiconductor devices are predominantly formed of aluminum-based materials. However, with the aluminum-based metal interconnections, if the design rule becomes finer than 0.5 $\mu$m, not only is the reliability of the interconnection deteriorated due to electromigration or the like, but the aspect ratio becomes as large as 1 to 2 on account of the necessity of maintaining a lower resistance value. This presents difficulties in a series of subsequent process steps such as formation of insulating films or planarization.

Under these circumstances, attention is directed to formation of the interconnection with copper-based metallic materials. Copper has a high resistance to electromigration and a low resistivity of ca. 1.4 $\mu\Omega$cm which is only about half of that of aluminum. Thus it becomes possible to reduce the thickness of the metal interconnection layer without deterioration in reliability, while the aspect ratio may also be diminished.

However, as to etching of the copper-based metallic materials, its potential is simply searched at the present stage, and many technical problems remain to be solved.

In the first place, since copper is highly susceptible to oxidation, the surface of the copper-based metallic materials is perpetually coated with copper oxide and thereby passivated. The presence of a copper oxide film is inconvenient in that not only is the chemical reaction between the etching gas and copper suppressed to lower the etchrate, but also the layer of the metallic material below the copper oxide film functioning as a mask may not be removed so that residues tend to be produced on a wafer.

On the other hand, it is well-known that copper may scarcely be etched with a halogen-based gas which is extensively utilized for etching other metal interconnection layers. It is because copper halides as reaction products are extremely low in vapor pressure at room temperature. For example, CuCl and CuCl$_2$ melt at 430° and 620° C., respectively. Thus, unless a wafer is heated to higher temperature for raising the vapor pressure, prompt vaporization of the reaction products can not be expected.

For this reason, in an etching process of eliminating copper in the form of chlorides, the wafer temperature has hitherto been set to approximately 200° to 400° C. For example, according to a technique reported in Japanese Journal of Applied Physics, Vol. 28, No. 6, pages L1070 to L1072, 1989, reactive ion etching of a thin copper film is effected with a SiCl$_4$—N$_2$ mixed gas while the wafer is heated to approximately 250° C.

On the other hand, there is disclosed in JP Patent KOKAI Publication No. 2-83930 (1990) a technique of patterning a layer of a copper-based material by the combination of dry etching and wet etching. Specifically, the layer of the copper-based material is etched by ion milling using a gas mixture of CCl$_4$ and Ar, after which the wafer is dipped in ethanol to dissolve and eliminate copper hydrochloride reaffixed to the pattern sidewall.

However, many problems remain to be solved with the above described prior-art techniques, which have not yet been put to practical use.

With the technique of heating the wafer for raising the vapor pressure of copper chloride as a reaction product, problems are raised in that, not only an etching mask need to be produced using a highly heat-resistant material, but also the formation of copper oxide tends to be accelerated due to residual oxygen in the etching chamber.

On the other hand, with the technique of using dry etching and wet etching in combination, although the deficiencies due to heating may be obviated, problems are raised in that the number of process steps is increased, a separate treatment vessel for wet etching is necessitated, and in that it is only CuCl$_2$ that may be dissolved and removed by ethanol, while CuCl$_1$ which is insoluble in ethanol, can not be removed.

Besides, the method for end point detection at the time of removal of copper as a halide by etching is currently not known, which also is inconvenient if the technique is to be put to practical use.

OBJECT AND SUMMARY OF THE INVENTION

It is a principal object of the present invention to overcome the above mentioned deficiencies in the dry etching of a copper-based thin film and to provide a practically useful method for end point detection.

In the course of researches towards achieving the above object, the present inventor has directed attention to the fact that an acute rise in the etchrate frequently results upon addition of O$_2$ to an etching gas system during dry etching of a metallic material. For example, when fluorine-based gases, such as SF$_6$ or NF$_3$, are used alone for etching a titanium-based material, etching scarcely proceeds because TiF$_x$ is solid at room temperature. However, if O$_2$ is added in a suitable quantity, etching may proceed smoothly. This is presumably because titanium oxyfluorides TiF$_x$O$_y$, considerably higher in vapor pressure than TiF$_x$, has now been formed. It is also known that, when tungsten etching is performed using a chlorine-based gas, tungsten oxychlorides are similarly formed to raise the etchrate.

The present invention has been realized on the basis of the foregoing and provides a dry etching method comprising etching a layer of a copper-based material using an etching gas including a compound containing Cl and O as component elements or an etching gas including a compound containing Cl as a component element and a compound contining O as a component element. It is contemplated that, by containing Cl and O in some manner in the etching gas, the copper be removed not simply as chlorides as in the conventional practice, but as oxychlorides as well. Among the copper oxychlorides CuCl$_x$O$_y$, where x is 1 to 2 and y is 1 to 8, there are copper chlorate Cu(ClO$_3$)$_2$ and copper perchlorate Cu(ClO$_4$)$_2$ as compounds having simpler structures. These melt at temperature of 65° C. and 82° C., respectively, which are markedly low as compared with the melting temperatures of CuCl or $CuCl_2$. In this manner, etching of the layer of the copper-based material may be performed at a temperature range closer to room temperature than heretofore, while there is the least risk of accelerated formation of an copper oxide film.

The present invention also proposes a method for detection of end point of etching, which method has proved to be a critical technique in executing the above etching. This detection is enabled by monitoring an emission spectrum of etching reaction products. In the etching reaction system, there exist a variety of chemical species, such as a reaction product CuCl, or fragments thereof, such as $Cu_2$ or Cu. It may be premeditated that these chemical species are produced in larger quantities during the progress of etching of the layer of copper-based materials, while being decreased acutely at a stage in which underlying layers, such as barrier metal layers, interlayer insulating films or semiconductor substrates, are exposed. Therefore, it becomes possible to detect the end point of etching highly acutely by suitably selecting peak intensities of spectral lines in an atomic spectrum of Cu or a molecular spectrum of CuCl or $Cu_2$, which may be observed rather easily, and by identifying the points of acute decrease in these intensities as the end point of etching.

In this manner, according to the present invention, it becomes possible to etch the layer of the copper-based material in a temperature range markedly lower than in the conventional techniques to prevent the inconveniences caused by heating wafer to higher temperatures. The practical merit of the invention may be further improved by enabling detection of the end point of etching of the layer of the copper-based material.

According to the present invention, the semiconductor devices exhibiting a high performance and a high integration degree may be improved significantly in productivity and operational reliability.

BRIEF DESCRIPTION OF THE DRAWINGS

FIGS. 1a and 1b are schematic cross-sectional views showing the etching process according to the present invention for etching a Cu layer on an interlayer insulating film, step by step, wherein FIG. 1a shows the pre-etching state of a wafer and FIG. 1b shows the state of end of etching of the Cu layer.

FIG. 2a shows the pre-etching state of a wafer, FIG. 2b shows the state of end of etching of the Cu layer and FIG. 2c shows the state of end of etching of the barrier metal layer.

DETAILED DESCRIPTION OF THE INVENTION

Figure 1A:
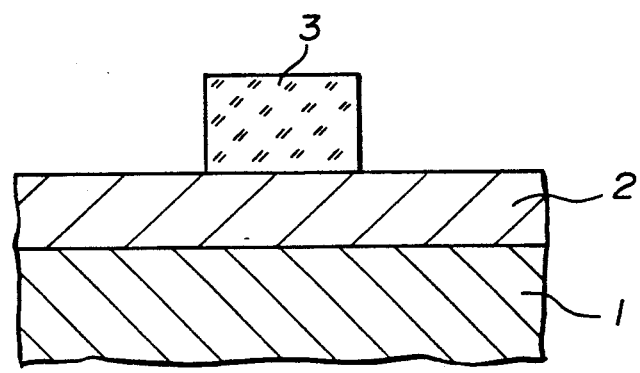

Referring to the drawings, preferred embodiments of the present invention will be explained in detail.

Example 1

In the present example, a Cu layer on an interlayer insulating film was etched using chlorine dioxide $ClO_2$. The present example is explained by referring to FIGS. 1a and 1b.

Referring to FIG. 1a, a Cu layer 2 was deposited as by sputtering on the entire surface of an interlayer insulating film 1 of silicon oxide, and a heat-resistant etching mask 3 was then selectively formed on the Cu layer 2. Although the etching mask 3 was formed herein using a silicon oxide layer deposited by CVD and patterned using a resist mask, spin-on-glass (SOG) or SiN may also be used as constituent materials.

Figure 1B:
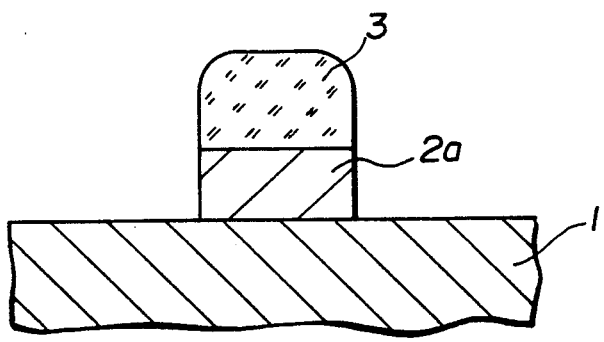

The wafer thus obtained was then placed on a parallel flat plate type reaction ion etching (RIE) device and etching was carried out while the wafer was heated to approximately 100° C., by means of a wafer-setting electrode, under conditions of a $ClO_2$ flow rate of 50 SCCM, a gas pressure of 6.7 Pa (50 mTorr) and an RF power density of 0.5 $W/cm^2$ (13.56 MHz). Since the wafer was not heated to higher temperatures, contrary to the conventional practice, etching proceeded smoothly without producing residues or forming copper oxide films in the etched region. As a result, a Cu electrode 2a could be formed with a good anisotropic profile, as shown in FIG. 1b.

It may be premeditated that, during this etching process, $Cu(ClO_3)_2$ or $Cu(ClO_4)_2$ is produced on the surface of the Cu layer 2 and sputtered by ions such as $Cl^+$, $Cl_2^+$, $O^+$ or $O_2^+$ to produce the anisotropic profile. Although the details of the etching mechanism is not precisely understood, it may be safely inferred that, since fragments represented by $SiF_x$, x being 1 to 3, are contained besides $SiF_4$ in the reaction product vaporized off during etching of the layer of the silicon material with fluorine-based gases, the reaction products are also vaporized off in the process of the present invention in the form of fragments represented by $CuCl_xO_y$.

Meanwhile, the etching gas used in the present invention is not limited to the above identified etching gas, provided that they are capable of producing Cl and O upon discharge decomposition.

The gases containing Cl and O as component elements within the same molecule may include $Cl_2O$, $Cl_2O_7$ and $HClO_4$. A gas mixture of a gas containing Cl as a component element and a gas containing O as a component element may also be employed. For example, anisotropic etching may also be achieved at a lower temperature range by feeding $Cl_2$ at a flow rate of 20 SCCM and $O_2$ at a flow rate of 30 SCCM instead of feeding $ClO_2$ at the flow rate of 50 SCCM as in the above example 1. Rare gases such as Ar or He and/or inert gases such as $N_2$ may be added suitably in expectation of sputtering, dilution or cooling effects.

Example 2

In the present example, the end point of etching is determined on the basis of molecular spectrum of CuCl when a Cu electrode for contacting the silicon wafer by means of a barrier metal layer is formed by etching. The present example is explained by referring to FIGS. 2a to 2c.

Figure 2A:
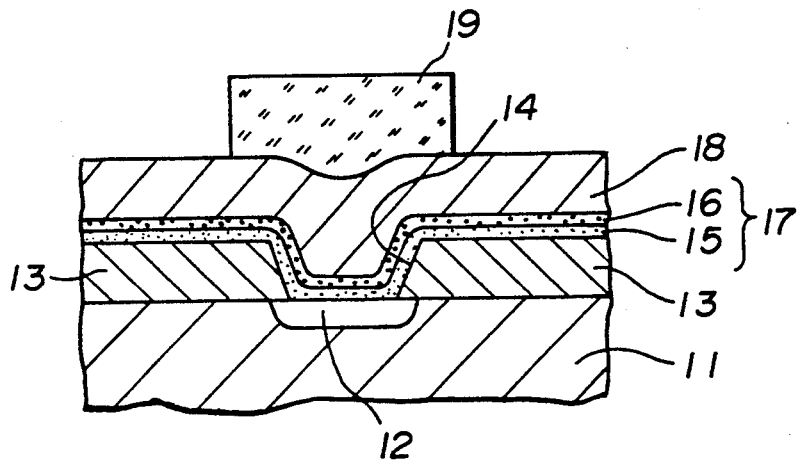
FIGS. 2a to 2c are schematic cross-sectional views showing the etching process according to the present invention for etching a Cu layer for forming a contact with the wafer by means of a barrier metal layer, step by step, where

Referring to FIG. 2a, a silicon oxide interlayer insulating film 13 was deposited on a silicon wafer 11 on which an impurity doped area 12 is previously formed. An opening 14 contiguous to the impurity doped area 12 was then formed in the interlayer insulating film 13. Then, for preventing a silicidation between the silicon wafer 11 and a Cu layer 18 to be formed subsequently, a thin Ti layer 15 and a thin TiON layer 16 are deposited step by step on the entire surface of the wafer to produce a barrier metal layer 17. The Cu layer 18 was then depostied on the entire surface of the wafer as by sputtering, and an etching mask 19 of silicon oxide was selectively formed. The resulting wafer was placed in a magnetic microwave plasma etching unit and heated to about 350° C. by means of a wafer setting electrode. Etching was then carried out under conditions of a $Cl_2$ flow rate of 50 SCCM, a $BCl_3$ flow rate of 10 SCCM, a gas pressure of 1.3 Pa (10 mTorr), a microwave power of 850 W and an RF bias power of 60 W (13.56 MHz).

Figure 2B:
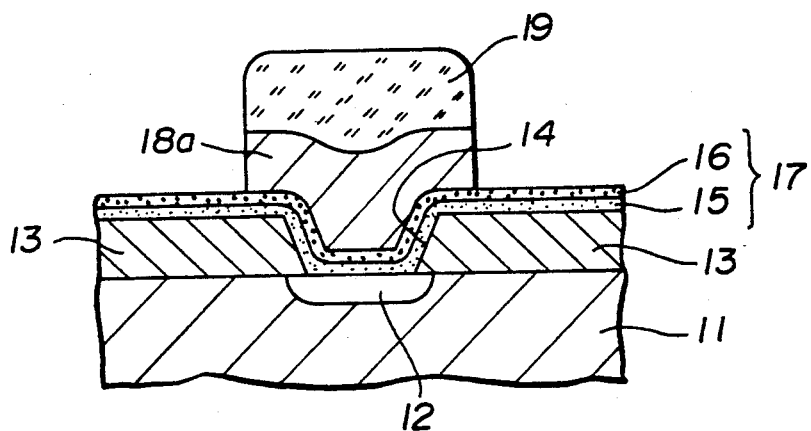

This etching was carried out while monitoring the emission spectrum. The wavelengths taken into consideration were those corresponding to six peak intensities which could be observed rather easily in the molecular spectrum of CuCl, namely 526 nm, 488 nm, 485 nm, 435 nm, 433 nm and 402 nm. The peak intensities appearing in these wavelengths represent the peak intensities in the band systems appearing in association with six transition states, namely $A^1\pi$-$X^1\Sigma$, $B^1\pi$-$X^1\Sigma$, $C^1\pi$-$X^1\Sigma$, $D^1\pi$-$X^1\Sigma$, $E^1\pi$-$X^1\Sigma$ and $F^1\pi$-$X^1\Sigma$. Etching of the Cu layer 18 was terminated at a time point when these peak intensities were decreased acutely. It was found that, as shown in FIG. 2b, a Cu electrode 18a was formed with good anisotropic profile and the underlying TiON layer 16 was exposed in the area to be etched.

Figure 2C:
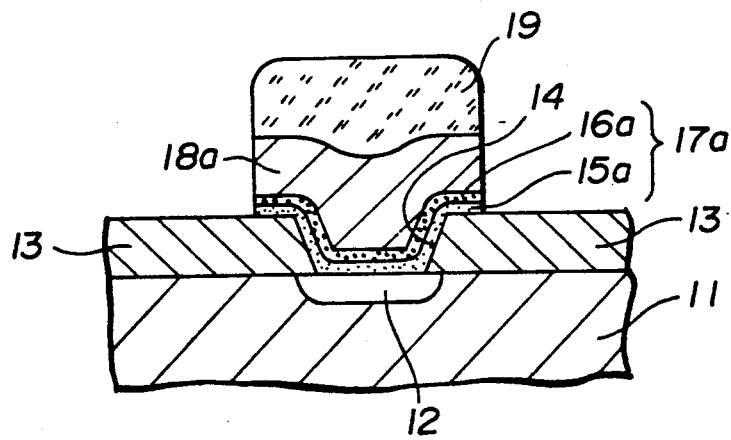

The barrier metal layer 17 was then etched under the same conditions as mentioned above except lowering the wafer heating temperature to about 100° C. This etching was carried out while changes in the peak intensities were monitored in a wavelength range of 410 to 420 nm in which the molecular spectrum of $TiCl_x$ could be observed, as already proposed by the present inventor. The etching was terminated at a time point when the above peak intensities disappeared and the emission intensities decreased in the entire wavelength range under observation. It was found that, as shown in FIG. 2c, a barrier metal pattern 17a consisting of a TiON pattern 16a and a Ti pattern 15a was formed with good anisotropic profile to complete the formation of the interconnection.

It is noted that the detection of the end point of etching of the Cu layer 18 of the present example 2 may also naturally be performed in the preceding example 1.

It is also noted that, since the end point of etching of the barrier metal layer 17 is detected, it may appear that detection of end point of etching of the Cu layer 18 is unnecessary, if selectivity with respect to the interlayer insulating film 13 only is to be taken into account. However, since $TiCl_3$ or $TiCl_4$ produced during etching of the titanium-based material with a chlorine-based gas has a vapor pressure higher than that of CuCl, an undercut tends to be produced in the barrier metal layer 17 if the Cu layer 18 and the barrier metal layer 17 are etched at the same wafer heating temperature. Thus, for performing the etching under optimum conditions for the respective layers, it is necessary to carry out detection of the end point of etching of the Cu layer 18.

It is also noted that peaks of high emission intensities other than the above mentioned six peaks proper to the molecular spectrum of CuCl may be suitably selected as the emission peaks used for detecting the end points of the Cu layer 18. Alternatively, molecular spectra derived from $A\ ^1\pi_u-X\ ^1\Sigma^+_g$ transition of $Cu_2$ appearing in a wavelength range of 485 to 500 nm may also be monitored.

Still alternatively, peak intensities exhibiting relatively strong emissions, such as those appearing at e.g. 327 or 325 nm, may be selected from the atomic spectra of Cu so as to be used for monitoring.

What is claimed is:

1. A dry etching method comprising reactive ion etching a layer of substantially pure copper material using an etching gas including a compound containing Cl and O as component elements or an etching gas including a compound containing Cl as a component element and a compound containing O as a component element, said etching processing producing volatile $CuCl_xO_y$ as a reaction product.

2. A dry etching method comprising etching a layer of a copper-based material with an etch gas including a compound containing Cl and O as component elements, said compound being at least one compound selected from the group consisting of $ClO_2$, $Cl_2O$, $Cl_2O_7$ and $HClO_4$.

3. A dry etching method as claimed in claim 1 characterized in that said compound containing Cl and O as component elements is at least one compound selected from the group consisting of $ClO_2$, $Cl_2O$, $Cl_2O_7$ and $HClO_4$.

* * * * *